(12) United States Patent
Hachino et al.

(10) Patent No.: US 7,719,873 B2
(45) Date of Patent: May 18, 2010

(54) MEMORY AND SEMICONDUCTOR DEVICE WITH MEMORY STATE DETECTION

(75) Inventors: Hidenari Hachino, Nagasaki (JP);
Hironobu Mori, Nagasaki (JP);
Nobumichi Okazaki, Kanagawa (JP);
Katsuhisa Aratani, Chiba (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 11/265,894

(22) Filed: Nov. 3, 2005

(65) Prior Publication Data

US 2006/0092737 A1 May 4, 2006

(30) Foreign Application Priority Data

Nov. 4, 2004 (JP) ............................. P2004-320503

(51) Int. Cl.
*G11C 11/00* (2006.01)
(52) U.S. Cl. .................... 365/148; 365/158; 365/163
(58) Field of Classification Search ................. 365/148, 365/158, 163
See application file for complete search history.

(56) References Cited

U.S. PATENT DOCUMENTS

| | | | |
|---|---|---|---|
| 6,188,615 B1* | 2/2001 | Perner et al. ............ | 365/189.01 |
| 6,842,362 B2* | 1/2005 | Fujita et al. ................. | 365/158 |
| 6,917,540 B2* | 7/2005 | Ooishi ........................ | 365/173 |
| 7,031,184 B2* | 4/2006 | Iwata ........................... | 365/158 |
| 7,224,598 B2* | 5/2007 | Perner ......................... | 365/148 |

FOREIGN PATENT DOCUMENTS

| | | |
|---|---|---|
| JP | 08-330944 | 12/1996 |
| JP | 2003-187590 | 7/2003 |
| JP | 2004-234707 | 8/2004 |
| WO | WO-03/054887 | 7/2003 |
| WO | WO-03/071549 | 8/2003 |

OTHER PUBLICATIONS

Japanese Office Action dated Aug. 26, 2008 for Application No. 2004-320503.

* cited by examiner

*Primary Examiner*—Huan Hoang
*Assistant Examiner*—Kretelia Graham
(74) *Attorney, Agent, or Firm*—Sonnenschein Nath & Rosenthal LLP

(57) ABSTRACT

A memory includes: memory elements arranged in a matrix, each memory element having such characteristics that when an electric signal at a level equal to or higher than that of a first threshold signal is applied to the memory element, the resistance thereof is changed from a high value to a low value, and when an electric signal at a level equal to or higher than that of a second threshold signal is applied thereto, the resistance is changed from the low value to the high value, the polarities of the first and second threshold signals being different from each other; electric circuits for applying electric signals to the memory elements; and detection units each for measuring a current flowing through the corresponding memory element or a voltage applied thereto from the start of the application of electric signals to detect whether the resistance is high or low.

6 Claims, 10 Drawing Sheets

MEMORY AND SEMICONDUCTOR DEVICE WITH MEMORY STATE DETECTION

CROSS REFERENCES TO RELATED APPLICATIONS

The present invention contains subject matter related to Japanese Patent Application JP 2004-320503 filed in the Japanese Patent Office on Nov. 4, 2004, the entire contents of which are incorporated herein by reference.

BACKGROUND OF THE INVENTION

1. Field of the Invention

The present invention relates to memories and semiconductor devices and, more particularly, to a memory and a semiconductor device, which detect a state of each memory element during a write sequence or an erase sequence to reduce time necessary for writing or erasing.

2. Description of the Related Art

In information equipment, such as computers, high-speed and high-density dynamic random access memories (DRAMs) are widely used as random access memories.

The DRAM is volatile, i.e., it loses information when powered off. Accordingly, a nonvolatile memory which does not lose information when powered off is preferable.

Up-and-coming nonvolatile memories include a ferroelectric memory (FeRAM), a magnetic memory (MRAM), a phase change memory, and a resistance change memory, such as a programmable metallization cell (PMC) or a resistance RAM (RRAM).

Those memories are capable of maintaining written information for a long time even when power is not supplied. Since the above memories are nonvolatile, refresh is unnecessary. Accordingly, power consumption can be reduced by the amount for refresh.

In addition, in the nonvolatile memory, such as a PMC or an RRAM, a memory layer for storing and maintaining information contains a material having such characteristics that the resistance depends on an applied voltage or current. In addition, each memory element has a relatively simple structure in which two electrodes are arranged, with the memory layer therebetween, and a current or a voltage is applied between the two electrodes. Accordingly, each memory element can be easily miniaturized.

The PMC is constructed such that an ionic conductor containing predetermined metal is arranged between two electrodes and any one of the two electrodes also contains the same metal as that in the ionic conductor. The structure has such properties that when a voltage is applied between the two electrodes, the electrical characteristic of the ionic conductor, such as resistance or capacitance, varies. The PMC utilizes the above-mentioned properties.

PCT Japanese Translation Patent Publication No. 2002-536840 (Patent Document 1) discloses an example of the PMC structure. In this example, an ionic conductor includes a solid solution of chalcogenide and metal, e.g., amorphous GeS or amorphous GeSe, and any one of two electrodes contains Ag, Cu, or Zn.

An example of the RRAM structure is disclosed in, e.g., "Novel Colossal Magnetoresistive Thin Film Nonvolatile Resistance Random Access Memory (RRAM)", W. W. Zhuan et al., Technical Digest "International Electron Devices Meeting", 2002, p. 193 (Non-patent Document 1). In this example, a thin film of polycrystalline $PrCaMnO_3$ is arranged between two electrodes and a voltage pulse or a current pulse is applied between the two electrodes, thus significantly changing the resistance of the thin film, serving as a recording layer. The polarity of a voltage pulse applied in recording (writing) information differs from that in erasing information.

An example of another RRAM structure is disclosed in, e.g., "Reproducible Switching Effect in Thin Oxide Films for Memory Applications", A. Beck et al., Applied Physics Letters, 2000, Vol. 77, pp. 139-141 (Non-patent Document 2). In this example, a thin film of monocrystalline or polycrystalline $SrZrO_3$ doped with a small amount of Cr is arranged between two electrodes and a current is supplied so as to flow between the electrodes, thus changing the resistance of the film, serving as a recording layer.

Non-patent Document 2 shows the I-V characteristic of the recording layer. A threshold voltage upon recording or erasing is ±0.5 V. In this structure, information can be recorded and erased by applying voltage pulses. A necessary pulse voltage is ±1.1 V and a necessary pulse width is 2 ms. In addition, high-speed recording and erasing can be performed. Non-patent Document 2 reports the operation using a voltage pulse width of 100 ns. In this case, a necessary pulse voltage is ±5 V.

In the FeRAM, it is currently difficult to perform nondestructive reading. Unfortunately, since destructive reading is performed, read speed is low. In addition, the FeRAM has a finite number of polarization reversals while reading or writing. This results in a limit in the number of rewritable times.

The MRAM needs a magnetic field in recording. Since the magnetic field is generated by a current supplied to a line, a large amount of current is necessary for recording.

As for the phase change memory, voltage pulses having the same polarity and different levels are applied to record data. In the phase change memory, switching depends on temperature. Disadvantageously, the phase change memory is sensitive to a change in environmental temperature.

In the PMC disclosed in Patent Document 1, the crystallization temperature of amorphous Ges or amorphous GeSe is approximately 200° C. If the ionic conductor is crystallized, the properties are altered. Unfortunately, the material is not capable of resisting high temperatures in a step upon actually manufacturing memory elements, e.g., in a step of forming a CVD insulating film or a protection film.

The memory layers proposed to be used in the PRAMs disclosed in Non-patent documents 1 and 2 are made of crystalline materials, respectively. Accordingly, there are the following problems: Thermal treatment at approximately 600° C. is necessary. It is very difficult to produce a single crystal of each proposed material. In the use of a polycrystal of each material, it is difficult to miniaturize memory elements due to the influence of grain boundary.

To solve the above-mentioned problems, e.g., Japanese Patent Application No. 2004-22121 (Patent Document 2) proposes a memory including memory cells. In this memory, each memory cell includes a memory element and a circuit element, serving as a load, connected in series to the memory element. The memory element has such characteristics that the resistance varies by the application of a voltage of a threshold voltage or higher across the memory element. The resistance of the memory element and that of the circuit element are combined into the combined resistance of the memory cell. The memory has the following characteristics: When a voltage applied between the memory element and the circuit element is equal to or higher than the threshold voltage, the combined resistance, obtained after the resistance of the memory element changes from a high value to a low value, has a substantially constant value independently of the voltage level. According to the proposed memory, stable recording can be realized and time necessary for recording can be reduced.

SUMMARY OF THE INVENTION

It is assumed that the operation for changing the resistance of the memory element from a high value to a low value is defined as writing, the operation for changing the resistance of the memory element from a low value to a high value is defined as erasing, and the operation for determining whether the memory element is conducting or insulating is defined as reading. The resistance after writing depends on the level of a pulse voltage or the pulse width. A fluctuation in the pulse voltage level or pulse width leads to a fluctuation in the resistance after writing. To ensure writing, it is necessary to execute a step of verifying the description of information after writing.

For example, according to one approach, after writing, the description of information written in a memory element is read out and is verified. If the resistance of the memory element is different from a desired resistance, information has to be rewritten to correct the resistance to the desired value.

In other words, after the completion of a write sequence, a read sequence is started and read data is compared to written data to determine whether data can be correctly written. According to the above-mentioned approach, the write sequence and the read sequence are individually performed. Therefore, two sequences have to be performed as the write operation including the verify step. Disadvantageously, this results in a long time necessary for recording. For example, it is difficult to overwrite data at a high speed.

The resistance after erasing similarly depends on the level of a pulse voltage or the pulse width. A fluctuation in the pulse voltage level or pulse width leads to a fluctuation in the resistance after erasing. To ensure erasing, it is necessary to execute a step of verifying the description of information after erasing. Similar to the write operation, therefore, two sequences have to be performed as the erasing operation including the verify step, resulting in a long time necessary for erasing.

Japanese Unexamined Patent Application Publication No. 2004-158143 discloses a technique for a high-speed verify mechanism of a resistance change memory element. According to the technique, a program pulse is applied to a memory cell and a verify operation is subsequently performed without changing a voltage applied to the corresponding word line. Actually, a write sequence (the application of a program pulse) and a read sequence (the verify operation) are individually implemented.

The present invention is made in consideration of the above disadvantages and it is desirable to provide a memory and a semiconductor device which are capable of reducing time necessary for writing and erasing.

According to an embodiment of the present invention, there is provided a memory including memory elements arranged in a matrix, electric circuits, and detection units. Each memory element has such characteristics that when an electric signal at a level equal to or higher than that of a first threshold signal is applied to the memory element, the memory element is changed from a first state to a second state, and when an electric signal at a level equal to or higher than that of a second threshold signal is applied thereto, the memory element is changed from the second state to the first state, the polarities of the first and second threshold signals being different from each other. The electric circuits apply electric signals to the memory elements. Each detection unit measures a current flowing through the corresponding memory element or a voltage applied to the memory element from the start of applying electric signals from the corresponding electric circuit to the memory element to detect whether the memory element is in the first or second state.

Accordingly, during a write sequence or an erase sequence, whether a memory element is in the first or second state can be determined by the corresponding detection unit.

According to an embodiment of the present invention, there is provided a memory including memory elements arranged in a matrix, electric circuits, and detection units. Each memory element has such characteristics that when an electric signal at a level equal to or higher than that of a first threshold signal is applied to the memory element, the resistance of the memory element is changed from a high value to a low value, and when an electric signal at a level equal to or higher than that of a second threshold signal is applied thereto, the resistance thereof is changed from the low value to the high value, the polarities of the first and second threshold signals being different from each other. The electric circuits apply electric signals to the memory elements. Each detection unit measures a current flowing through the corresponding memory element or a voltage applied to the memory element from the start of applying electric signals from the corresponding electric circuit to the memory element to detect whether the resistance of the memory element is high or low.

According to an embodiment of the present invention, there is provided a semiconductor device having a memory including memory elements arranged in a matrix, electric circuits, and detection units. Each memory element has such characteristics that when an electric signal at a level equal to or higher than that of a first threshold signal is applied to the memory element, the resistance of the memory element is changed from a high value to a low value, and when an electric signal at a level equal to or higher than that of a second threshold signal is applied thereto, the resistance thereof is changed from the low value to the high value, the polarities of the first and second threshold signals being different from each other. The electric circuits apply electric signals to the memory elements. Each detection unit measures a current flowing through the corresponding memory element or a voltage applied to the memory element from the start of applying electric signals from the corresponding electric circuit to the memory element to detect whether the resistance of the memory element is high or low.

Accordingly, during a write sequence or an erase sequence, whether the resistance of a memory element is high or low can be detected by the corresponding detection unit.

According to the memory and the semiconductor device according to the embodiments of the present invention, whether a memory element is changed to a desired state can be detected during a write sequence or an erase sequence. Advantageously, a read sequence which has been necessary and follows the write sequence or the erase sequence is not needed. Thus, time necessary for writing and that for erasing can be reduced.

DESCRIPTION OF THE PREFERRED EMBODIMENTS

Embodiments of the present invention will be described below with reference to the drawings to provide an understanding of the present invention. In the following embodiments, a resistance change memory element (hereinafter, referred to a memory element) is used in each memory cell and a memory includes such memory cells.

Figure 1A:
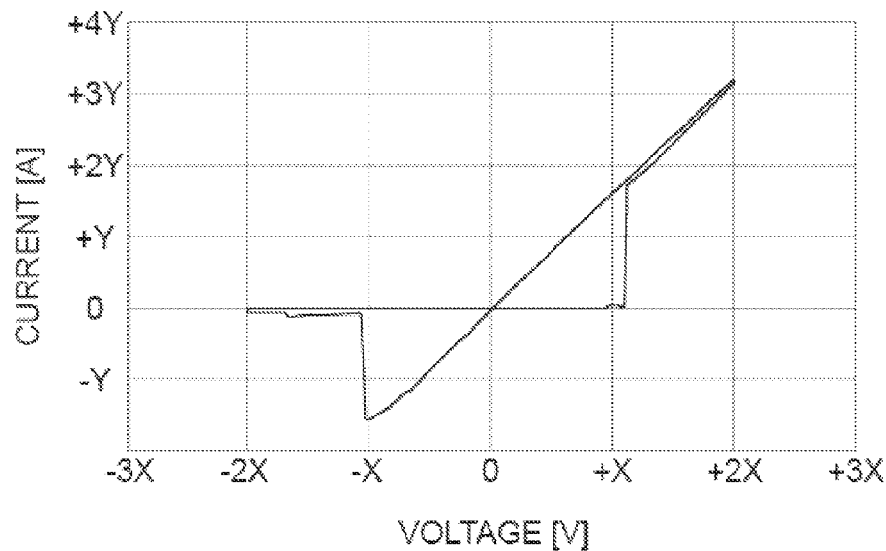
FIG. 1A is a graph showing the current-voltage characteristic of a memory element.

FIG. 1A is a graph showing the current-voltage (I-V) characteristic of a memory element used in a memory according to an embodiment of the present invention.

Figure 1B:
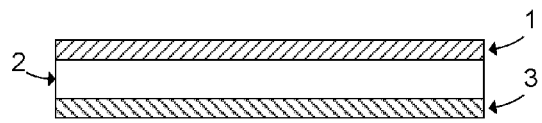
FIG. 1B is a diagram showing a memory element.

The memory element having the I-V characteristic shown in FIG. 1A includes, e.g., a memory element including a first electrode 1 and a second electrode 3 (e.g., lower and upper electrodes) and a memory layer arranged between the first electrode 1 and second electrode 3, the memory layer 2 including an amorphous thin film, such as a rare-earth oxide film as shown in FIG. 1B.

In the initial state of the memory element, the resistance thereof is large (e.g., 1 MΩ or higher), i.e., a current is difficult to flow therethrough. When a voltage of +1.1X [V] (e.g., +0.5 V) or higher is applied as shown in FIG. 1A, the current sharply increases and the resistance decreases (to, e.g., several kΩ). Then, the memory element exhibits Ohmic characteristics and the current flows therethrough in proportion to the voltage. In other words, the resistance indicates a constant value. After that, when the voltage is returned to 0 V, the resistance is kept (at a low value).

In the following description, the above-mentioned operation will be referred to writing and such a state will be called conducting. An applied voltage at that time will be called a write threshold voltage.

A voltage having a polarity opposite to that upon writing is applied to the memory element and an applied voltage is increased. When a voltage of −1.1X [V] (for example, −0.5 V) is applied to the memory element, a current flowing therethrough sharply decreases, i.e., the resistance rapidly increases. The resistance is changed to a high value (e.g., 1 MΩ or higher) which is equal to that in the initial state. After that, even when the voltage is returned to 0 V, the resistance is kept (at a high value).

In the following description, the above-mentioned operation will be referred to erasing and such a state will be called insulating. An applied voltage at that time will be called an erase threshold voltage.

As mentioned above, when a positive or negative voltage is applied to the memory element, the resistance thereof can be reversibly changed in the range of several kΩ to approximately 1 MΩ. When a voltage is not applied to the memory element, i.e., when a voltage is 0 V, the conducting state and the insulating state, namely, two states can be obtained. Those states are allowed to correspond to data "1" and data "0", respectively. Thus, 1-bit data can be stored.

In FIG. 1A, an applied voltage is in the range of −2X to +2X. If an applied voltage is higher than +2X V, the resistance of the memory element used in the memory according to the present embodiment changes very little.

Figure 2A:
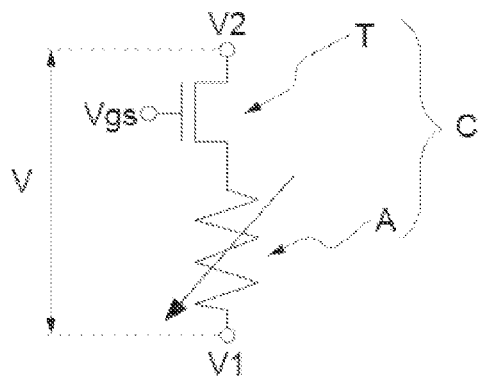
FIGS. 2A and 2B are circuit diagrams each explaining a memory cell used in a memory according to an embodiment of the present invention.
Figure 2B:
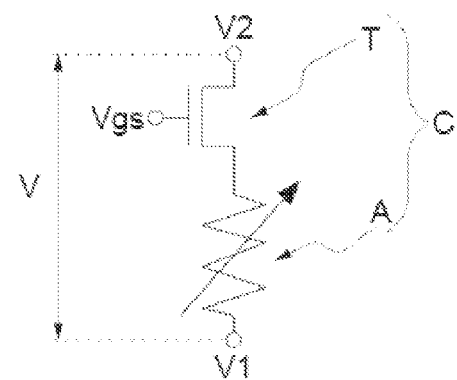

FIGS. 2A and 2B are circuit diagrams explaining a memory cell used in the memory according to the present embodiment of the present invention. A memory cell C includes a memory element A and a MOS transistor T, of which one terminal is connected in series to one terminal of the memory element A.

A terminal voltage V1 is applied to the other terminal of the memory element A. A terminal voltage V2 is applied to the other terminal (e.g., the source terminal) of the MOS transistor T. A gate voltage Vgs is applied to the gate of the MOS transistor T.

The terminal voltages V1 and V2 are applied the respective terminals of the memory element A and the MOS transistor T constituting one memory cell, thus generating a potential difference V (=|V2−V1|) between the terminals.

Generally, the resistance of the memory element upon writing is preferably equal to or higher than the on-resistance of the MOS transistor. The reason is as follows: When the resistance of the memory element is low at the start of erasing, most of the potential difference between the terminals is concentrated on the MOS transistor, so that power is lost. Disadvantageously, the applied voltages cannot be efficiently used to change the resistance of the memory element. On the other hand, at the start of writing, the resistance of the memory element is adequately high, most of the voltages are applied to the memory element. The above-mentioned problem does not occur.

In terms of the polarity of the memory element and that of the MOS transistor, two types of memory cell configurations shown in FIGS. 2A and 2B are possible.

In each of FIGS. 2A and 2B, the arrow on the memory element denotes the polarity. When a voltage is applied in the direction shown by the arrow, the memory element is changed from the insulating state to the conducting state, i.e., the write operation is performed.

FIGS. 3 to 6 are circuit diagrams explaining examples of memories (memory arrays) to which the present invention is applied. Each memory array includes the memory cells shown in FIG. 2A or 2B arranged in a matrix. According to the polarity of the memory element, that of the MOS transistor, and the arrangement relation between the memory element and the MOS transistor, four types of memory arrays shown in FIGS. 3 to 6 are possible.

The memory arrays in FIGS. 3 to 6 are operated in the same manner. Accordingly, the circuit in FIG. 3 will now be described as an example.

Figure 3:
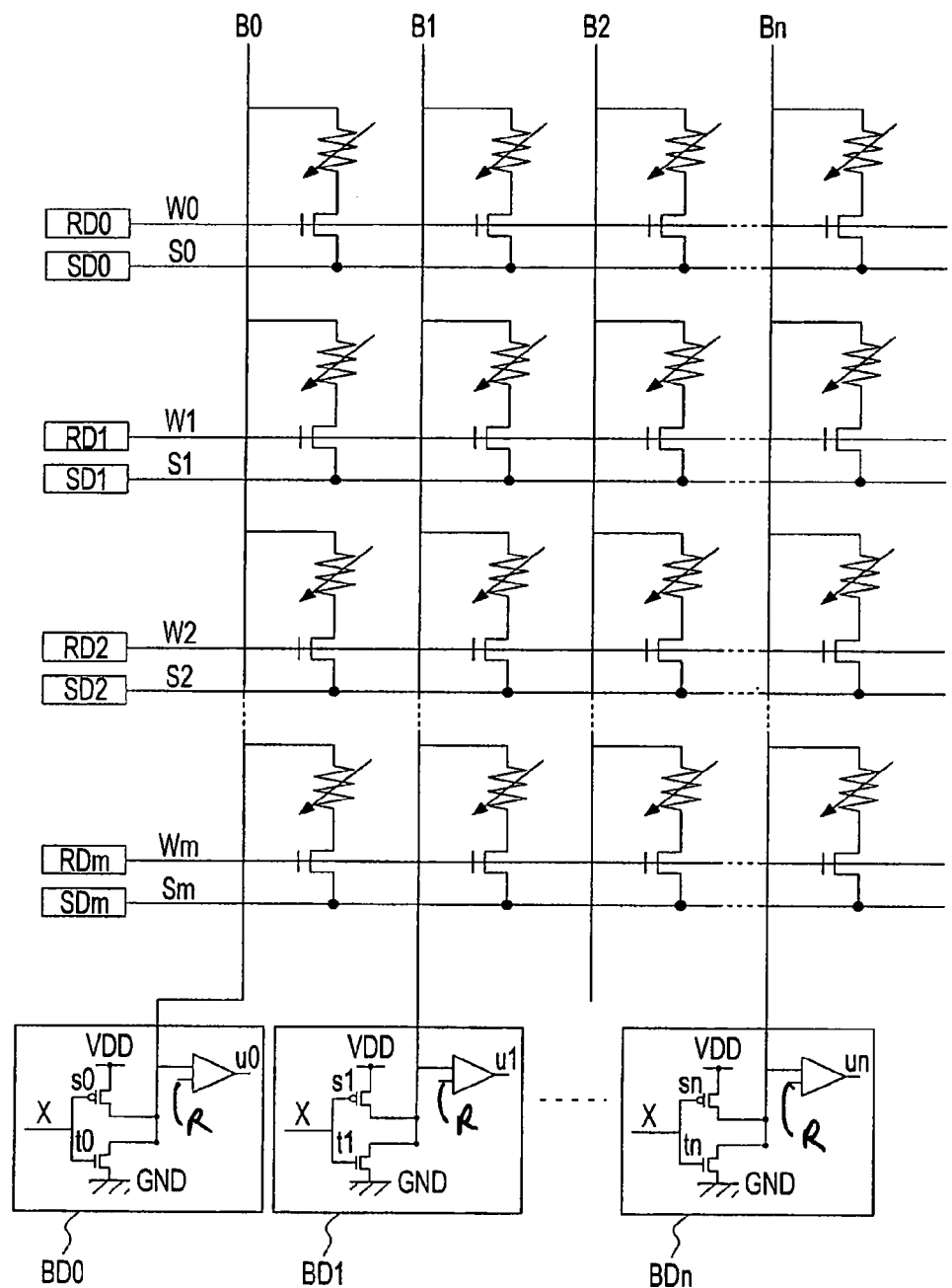
FIG. 3 is a circuit diagram explaining a memory according to the embodiment of the present invention.
Figure 4:
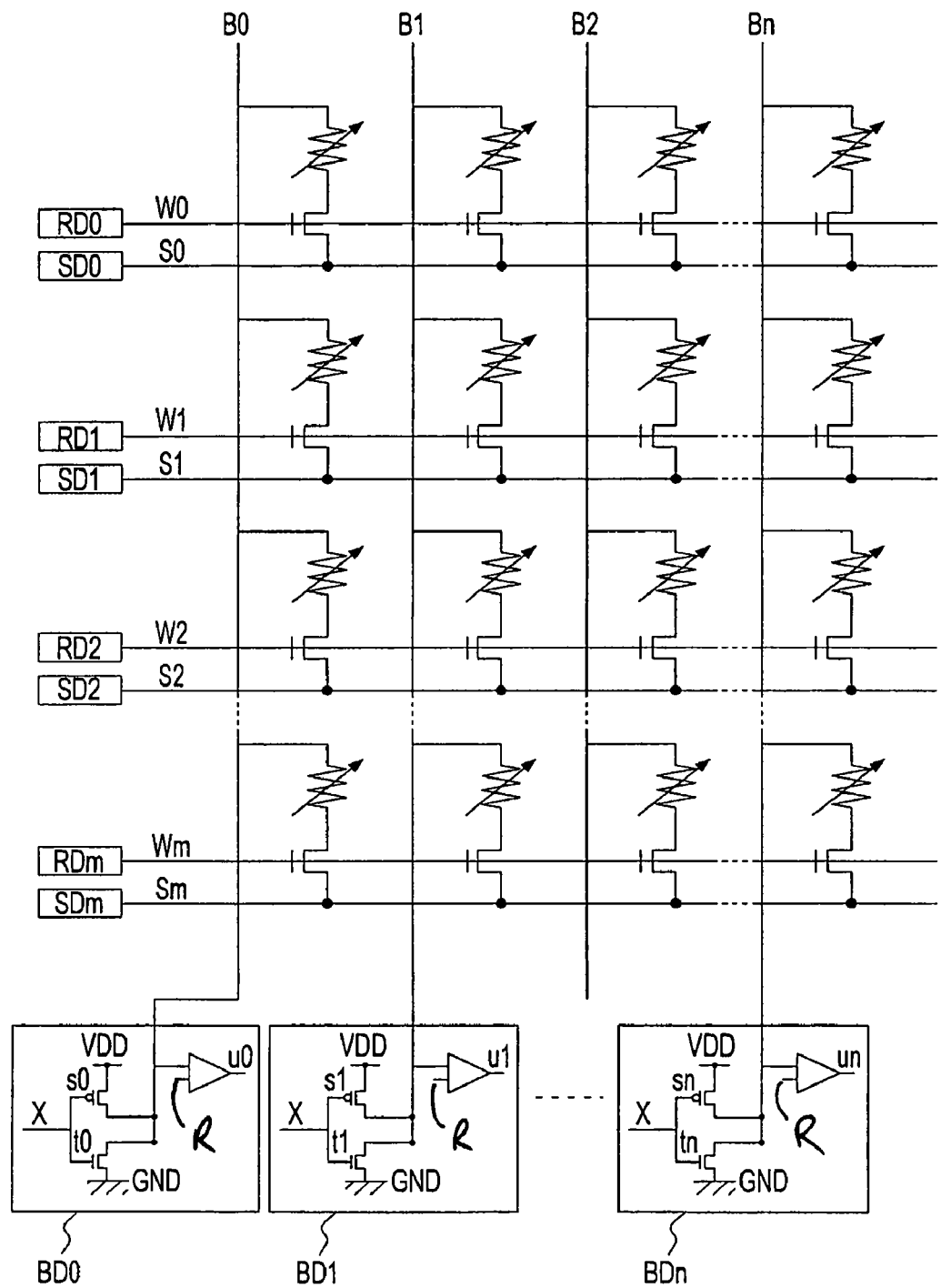
FIG. 4 is a circuit diagram explaining another memory according to the embodiment of the present invention.
Figure 5:
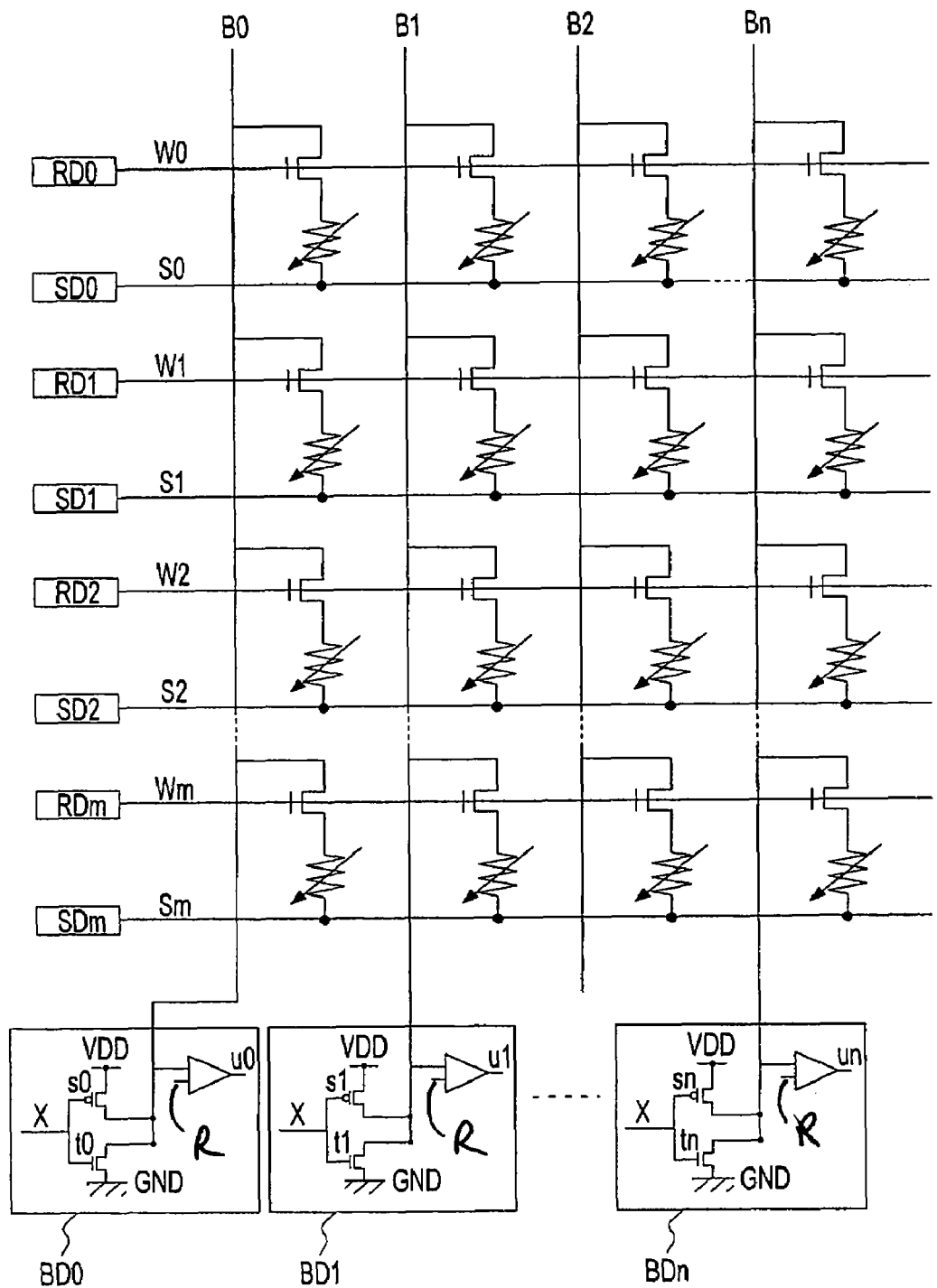
FIG. 5 is a circuit diagram explaining another memory according to the embodiment of the present invention.
Figure 6:
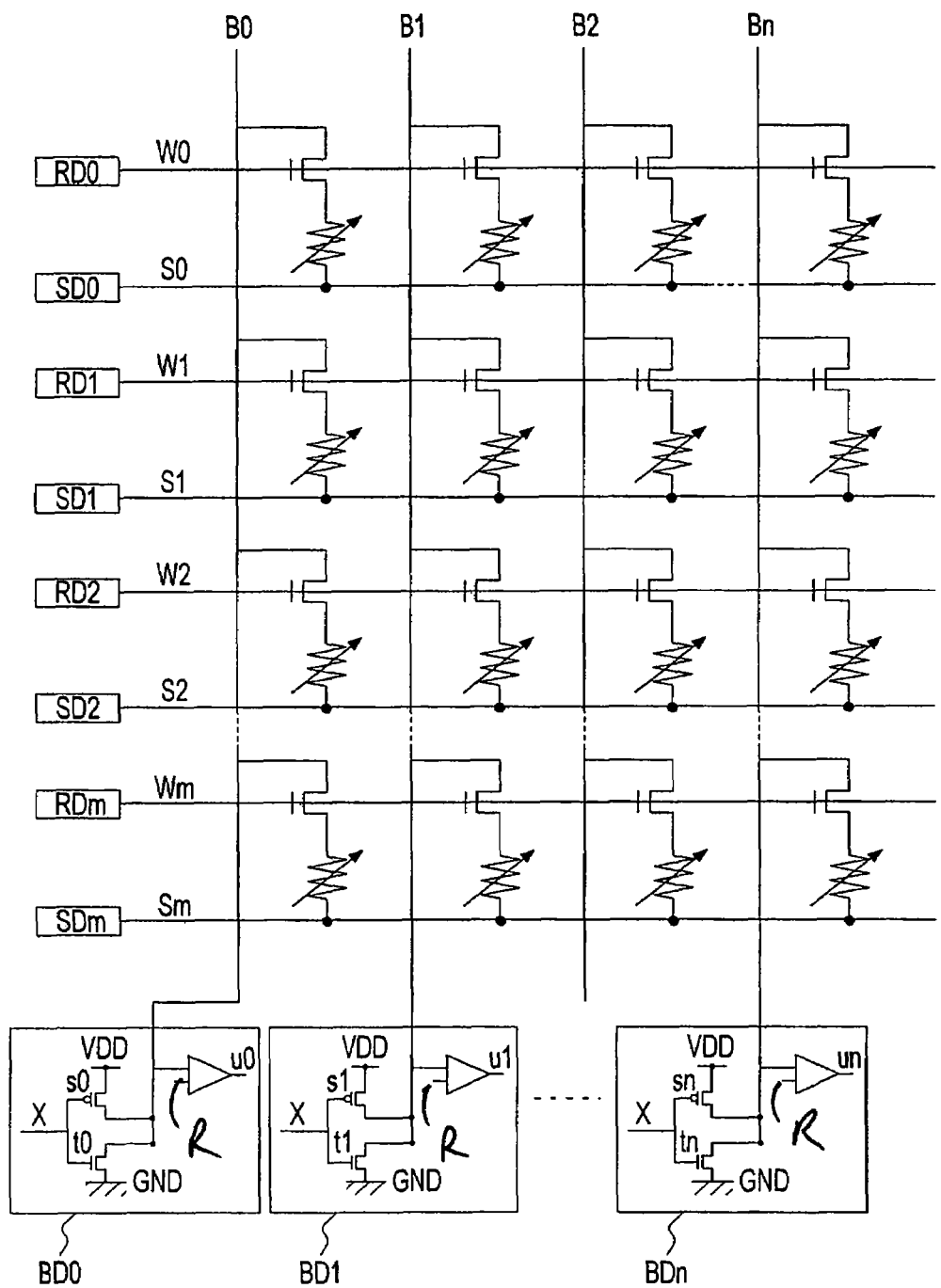
FIG. 6 is a circuit diagram explaining another memory according to the embodiment of the present invention.

Referring to FIG. 3, the memory includes memory cells in a matrix of (m+1) rows and (n+1) columns. As shown in FIGS. 2A and 2B, each memory cell includes a memory element and a MOS transistor, one terminal of the memory element being connected to one terminal (the drain) of the MOS transistor.

The gate of each MOS transistor T is connected to a word line W (W0 to Wm). The other terminal (the source) of the MOS transistor is connected to a source line S (S0 to Sm). The other terminal of the memory element is connected to a bit line B (B0 to Bn). Each bit line B is connected to a bit decoder BD (BD0 to BDn), serving as a voltage control circuit for the line B. Each word line W is connected to a row decoder RD (RD0 to RDm), serving as a voltage control circuit for the line W. Each source line S is connected to a source decoder SD (SD0 to SDm), serving as a voltage control circuit for the line S.

Each bit decoder BD (BD0 to BDn) includes a p-type MOS transistor s (s0 to sn), an n-type MOS transistor t (t0 to tn), and a sense amplifier u (u0 to un). One terminal of the p-type MOS transistor s is connected to a power supply voltage VDD (1.8 V). The other terminal thereof is connected to the corresponding bit line B. One terminal of the n-type MOS transistor t is connected to the ground potential. The other terminal thereof is connected to the corresponding bit line B. A write signal X is applied to each of the gate terminal of the p-type MOS transistor s and that of the n-type MOS transistor t. When the write signal is at a high level (hereinbelow, referred to as an H level), the p-type MOS transistor s is turned off and the n-type MOS transistor t is turned on. When the write signal X is at a low level (hereinafter, referred to as an L level), the p-type MOS transistor s is turned on and the n-type MOS transistor t is turned off. Each sense amplifier u is connected to the corresponding bit line B in order to measure the potential of the bit line B.

In the memory with the above-mentioned configuration, the write operation and the erase operation can be performed in the following manner. Prior to writing or erasing, the potential of each bit line is equal to that of each source line and the potential difference between memory cells is 0 V.

Figure 7A:
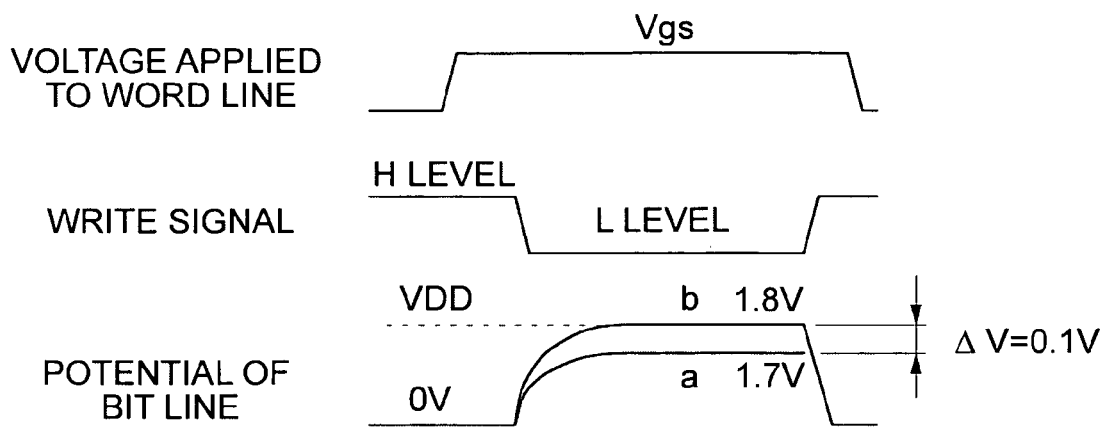
FIGS. 7A and 7B are diagrams explaining an example of the write operation of a memory cell.

Write Operation (see FIG. 7A)

[1] To write information to a memory cell, first, the corresponding row decoder RD applies a gate voltage Vgs to the corresponding word line W to turn on the gate of the MOS transistor T in the memory cell. In addition, the corresponding source decoder SD applies the ground potential to the corresponding source line S.

[2] Subsequently, a write signal X to be supplied to the gate terminal of each of the p-type MOS transistor s and the n-type MOS transistor t in the corresponding bit decoder BD is set to the L level to turn on the p-type MOS transistor s, thus applying a write voltage to the corresponding bit line B. Consequently, a voltage equal to or higher than the write threshold voltage is applied to the memory element, thus writing information to the memory element.

[3] After a lapse of sufficient time, the potential of the corresponding bit line is at a constant value (i.e., in the steady state). The potential of the bit line B is measured to determine whether the write operation is performed.

In other words, if the write operation is performed and the memory element is switched into the conducting state, the potential of the corresponding bit line B is determined by the ratio of the on-resistance of the p-type MOS transistor s to that of the memory cell. When the on-resistance of the p-type MOS transistor s is about 10 times that of the memory cell, the bit line potential is approximately 1.7 V (refer to symbol a in FIG. 7A). On the other hand, if the write operation is not performed and the memory element is maintained in the insulating state, a current flows very little through the memory cell. Accordingly, the bit line potential is approximately 1.8 V (refer to symbol b in FIG. 7A). Therefore, a reference potential R of the sense amplifier u is set to 1.75 V and the bit line potential is measured. When the bit line potential is 1.75 V or lower, it is determined that the write operation is performed and the memory element is switched into the conducting state.

[4] After it is confirmed that the memory element is switched into the conducting state and the write operation is performed, the write signal X is set to the H level and the falling edge of the corresponding word line W is caused, thus terminating the write operation.

Figure 7B:
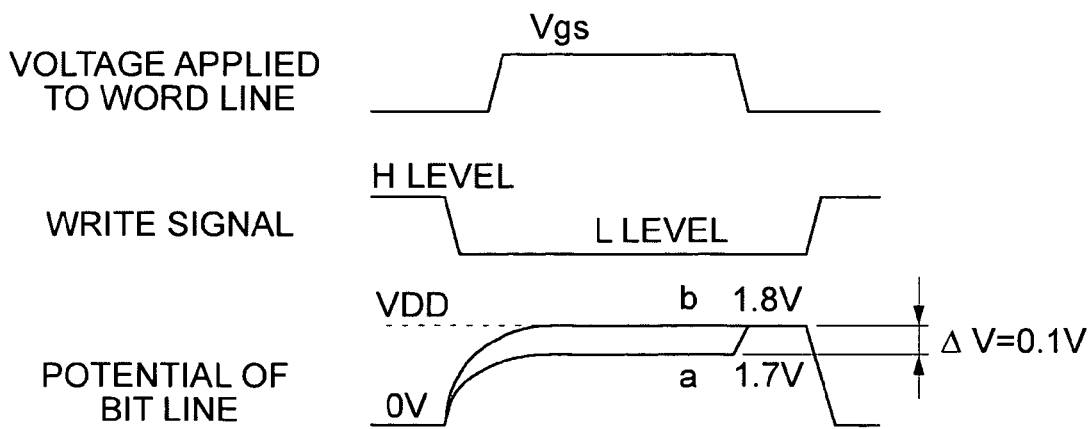

In the above case, the write signal X goes to the L level after the rising edge of the word line W. Alternatively, as shown in FIG. 7B, after the write signal X is set to the L level, the rising edge of the word line W can be caused.

In order not to perform the write operation on each memory cell in which information has not to be recorded, a voltage of 0 V is applied to the word lines W other than the word line W corresponding to the memory cell in which information has to be recorded and the potential to be applied to the bit lines B other than the bit line B corresponding to the memory cell, in which information has to be recorded, is the same as that to the source lines S other than the source line S corresponding thereto.

In the above description, according to the present embodiment, a voltage applied to the memory element is measured, more specifically, a voltage drop caused in the corresponding bit decoder BD by applying a voltage to the memory element is measured to determine whether the write operation is performed in the memory element. The method for determining whether the write operation is performed is not limited to the measurement of a voltage drop occurred in a bit decoder BD.

Other methods for determining whether the write operation is performed will now be described below. According to those methods, a current flowing through a memory element is measured, more specifically, a voltage changed by a current flowing through a memory element is measured to determine whether the write operation is performed in the memory element.

First Method

Figure 8A:
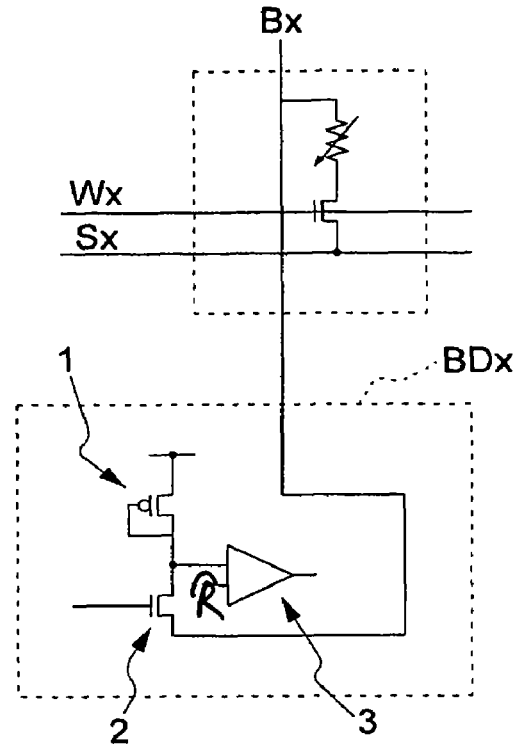
FIGS. 8A and 8B are diagrams explaining the first of other methods for determining whether the write operation is performed.

FIG. 8A is a schematic diagram explaining a bit decoder for the first of the other methods for determining whether the write operation is performed. A bit decoder BDx includes a load p-type MOS transistor (hereinbelow, referred to as a load PMOS) 1, a control n-type MOS transistor (hereinafter, referred to as a control NMOS) 2, and a sense amplifier 3. One terminal of the load PMOS 1 is connected to one terminal of the control NMOS 2. The other terminal of the load PMOS 1 is connected to a power supply voltage VDD (2.5 V). The other terminal of the control NMOS 2 is connected to a bit line Bx. The gate terminal of the load PMOS 1 is connected to the one terminal of the control NMOS 2. A write signal X is applied to the gate terminal of the control NMOS 2. The sense amplifier 3 is arranged so as to measure a voltage drop which occurs in the load PMOS 1. The width of the gate of the control NMOS 2 is sufficiently large. After a lapse of sufficient time, the potential of the bit line is independent of the resistance of the memory element and is obtained by [(gate voltage of the control NMOS 2)−(threshold voltage of the control NMOS 2)], e.g., it is 1.0 V.

In the use of the bit decoder BDx having the above-mentioned configuration, in the steady state, a voltage applied to a memory cell is substantially constant independently of the resistance of the corresponding memory element and a current flowing through the memory cell depends on the resistance of the memory element. Since the current flowing through the memory cell is equal to a current flowing through the corresponding load PMOS 1, a voltage drop which occurs by the current flowing through the load PMOS 1 is measured, thus determining whether the write operation is performed in the memory cell.

Figure 8B:
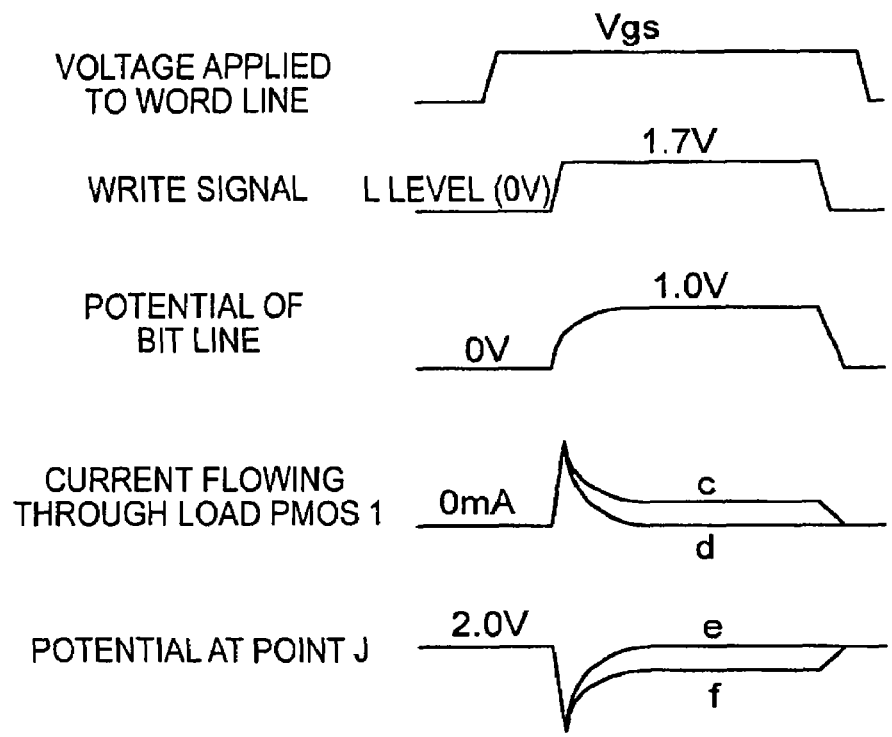

In other words, if the write operation is performed and the memory element is switched into the conducting state, a current flows through the corresponding load PMOS 1 (refer to symbol c in FIG. 8B). A voltage drop occurs in the control NMOS 2 depending on the current value. Thus, the potential at a point J in FIG. 8A varies (refer to symbol f in FIG. 8B). On the other hand, if the write operation is not performed and the memory element is kept in the insulating state, a current flows very little through the load PMOS 1 (refer to symbol d in FIG. 8B). Consequently, a voltage drop occurs only slightly in the load PMOS 1 and the potential at the point J in FIG. 8A changes very little (refer to symbol e in FIG. 8B). Therefore, when the potential at the point J in FIG. 8A is measured by the sense amplifier 3 and it is equal to or lower than a preset value, it is determined that the write operation is performed and the memory element is switched into the conducting state.

When a plurality of sense amplifiers are arranged, alternatively, when the potential is measured multiple times while a set value is changed, the resistance can be more precisely determined. In addition, when a voltage applied to the bit line Bx is set equal to or lower than the write threshold voltage of the memory element (strictly, a voltage applied to the memory element is set equal to or lower than the write threshold voltage), the bit decoder BDx shown in FIG. 8A can also be used as a circuit for detecting the resistance of the memory element, i.e., a so-called read circuit.

Figure 9:
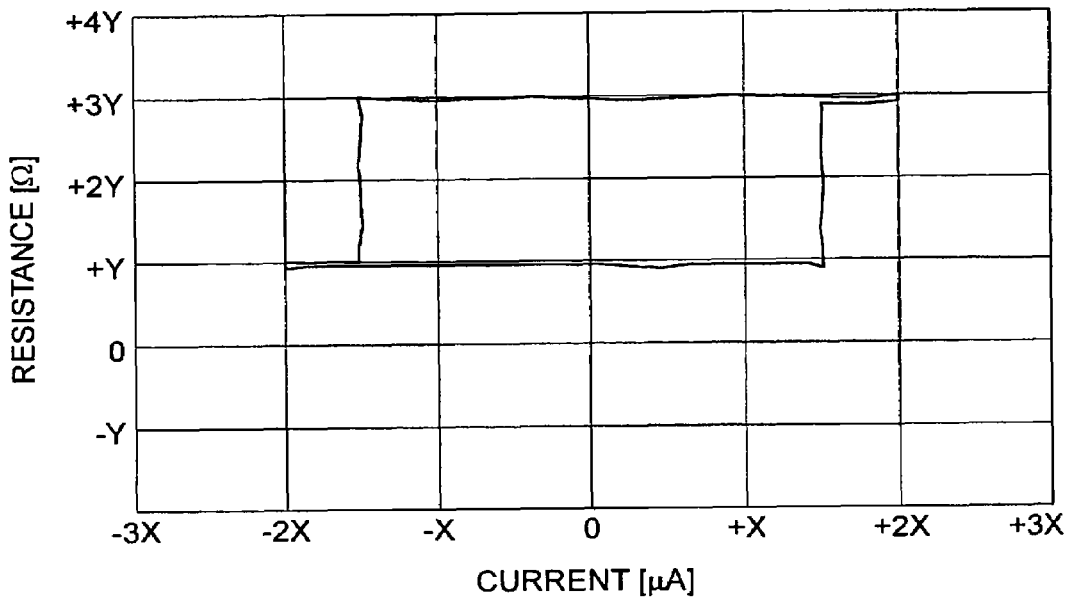
FIG. 9 is a graph showing the current-resistance characteristic of a memory element.

FIG. 9 is a graph showing the current-resistance (I-R) characteristic of a memory element which is used for a modification of the first method for determining whether the write operation is performed.

The memory element having the I-R characteristic in FIG. 9 includes a memory element having first and second electrodes (e.g., lower and upper electrodes) and a memory layer arranged therebetween, the memory layer including at least two magnetic films, the magnetic films being separated by an insulator or a conductor.

In the initial state, the memory element has a low resistance (e.g., 5 k$\Omega$). As shown in FIG. 9, when a current of +1.5X [A] (e.g., 100 µA) or higher flows through the memory element, the resistance increases (to, e.g., 6 k$\Omega$). Then, the resistance indicates a constant value. After that, when a current decreases to 0 A, the resistance is kept (at a high value).

Subsequently, a reverse current flows through the memory element and the current value increases. When a current of −1.5X [A] (e.g., −100 µA) flows, the resistance decreases to a low value (e.g., 5 k$\Omega$) which is equal to that in the initial state. After that, when a current increases to 0 A, the resistance is kept (at a low value).

As mentioned above, a positive or negative current flows through the memory element, so that the resistance of the memory element can be reversibly changed in the range of 5 to 6 k$\Omega$. When no current flows through the memory element, i.e., a current is 0 A, two states, i.e., a low resistance state and a high resistance state can be obtained. Those states are allowed to correspond to data "1" and data "0", respectively. Thus, 1-bit data can be stored.

In FIG. 9, a current is in the range of −2X to +2X. If a current is higher than +2X, the resistance of the memory element changes only slightly.

Figure 10:
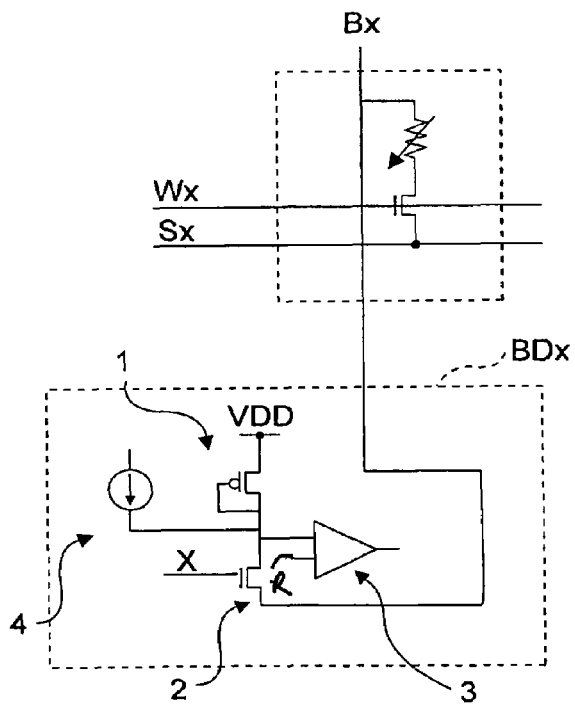
FIG. 10 is a diagram explaining a modification of the first method.

As mentioned above, in a case where the different in current between the high resistance state and the low resistance state is small, when a constant current circuit 4 is arranged in parallel to the load PMOS 1 as shown in FIG. 10, the ratio of the difference in current between the high and low resistance states to the entire current can be increased. Thus, a large differential output voltage can be obtained.

Second Method

Figure 11A:
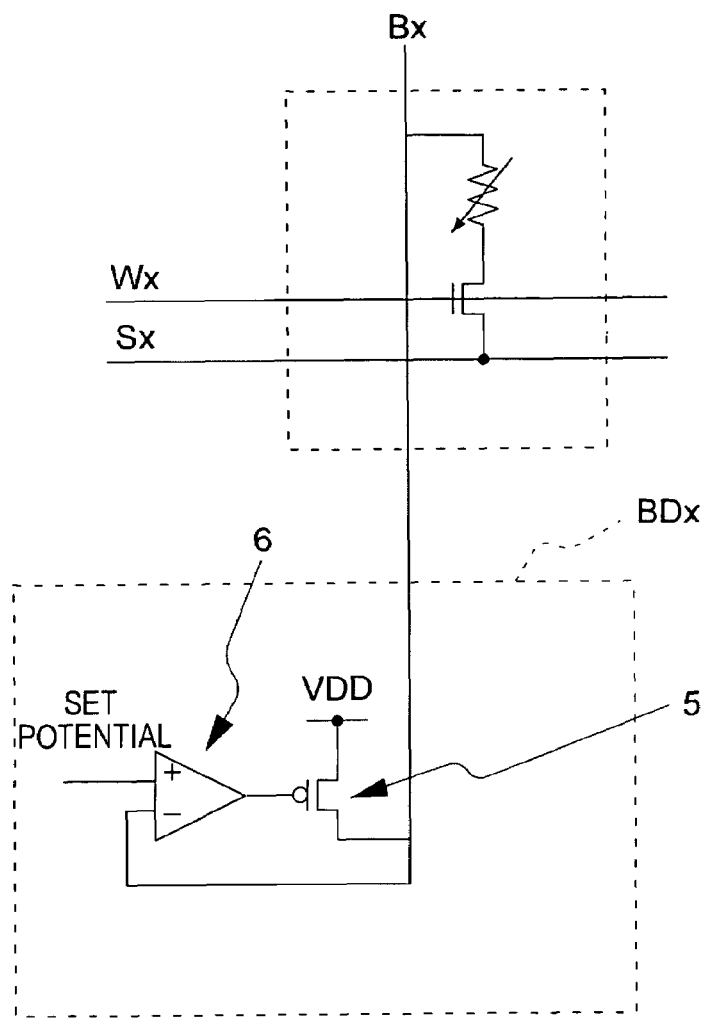
FIGS. 11A and 11B are diagrams explaining the second of the other methods for determining whether the write operation is performed.

FIG. 11A is a schematic diagram explaining a bit decoder used for the second of the other methods for determining whether the write operation is performed in a memory element. In FIG. 11A, a bit decoder BDx includes a p-type MOS transistor 5 and a sense amplifier 6. One terminal of the p-type MOS transistor 5 is connected to a power supply voltage VDD (1.8 V) and the other terminal thereof is connected to a bit line Bx. The positive-phase input terminal of the sense amplifier 6 receives a set potential (1.0 V) and the negative-phase input terminal thereof is connected to the bit line Bx. The output of the sense amplifier 6 is connected to the gate of the p-type MOS transistor 5. In the circuit having the above configuration, when the potential of the bit line Bx is equal to or lower than the set potential, the p-type MOS transistor 5 is turned on. When the potential of the bit line Bx increases and exceeds the set potential, the p-type MOS transistor 5 is turned off. Thus, the bit line potential is equal to the set potential.

Figure 11B:
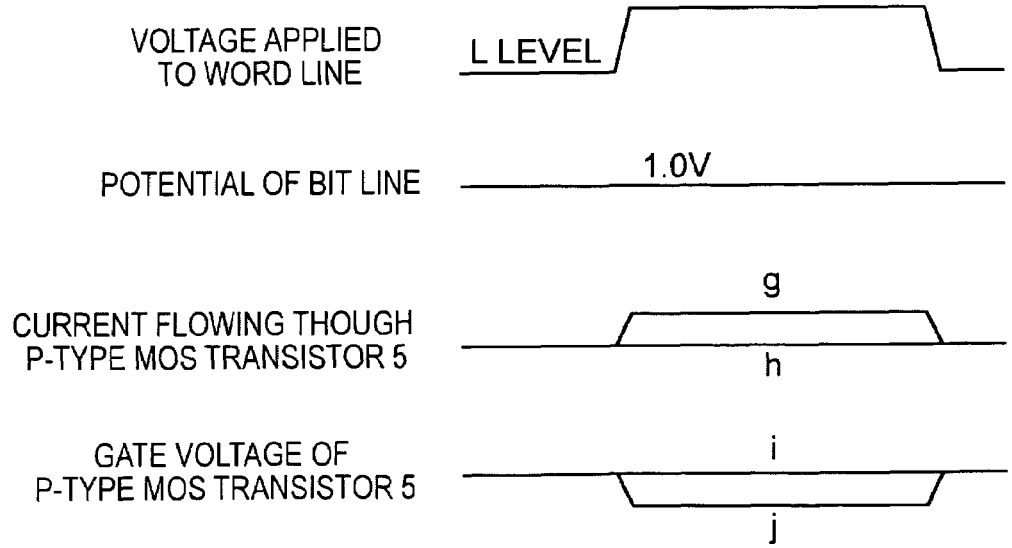

In the use of the bit decoder BDx having the above-mentioned configuration, when the write operation is performed and the memory element is switched into the conducting state, a current flows through the corresponding memory cell. When a current flows through the memory element, the bit line potential decreases due to discharge, so that the p-type MOS transistor 5 is turned on (refer to symbol g in FIG. 11B). In the steady state, the gate voltage of the p-type MOS transistor 5 is controlled so that a current flowing through the p-type MOS transistor 5 is equal to that flowing through the memory cell (refer to symbol j in FIG. 11B).

On the other hand, when the write operation is not performed and the memory element is kept in the insulating state, a current flows very little through the memory cell. Thus, the p-type MOS transistor 5 is maintained in the OFF state (refer to symbols h and i in FIG. 11B).

Therefore, after a lapse of sufficient time, the gate voltage of the p-type MOS transistor 5 is measured. When the gate voltage thereof is equal to or lower than the set potential, it is determined that the write operation is performed and the memory element is switched into the conducting state.

Figure 12A:
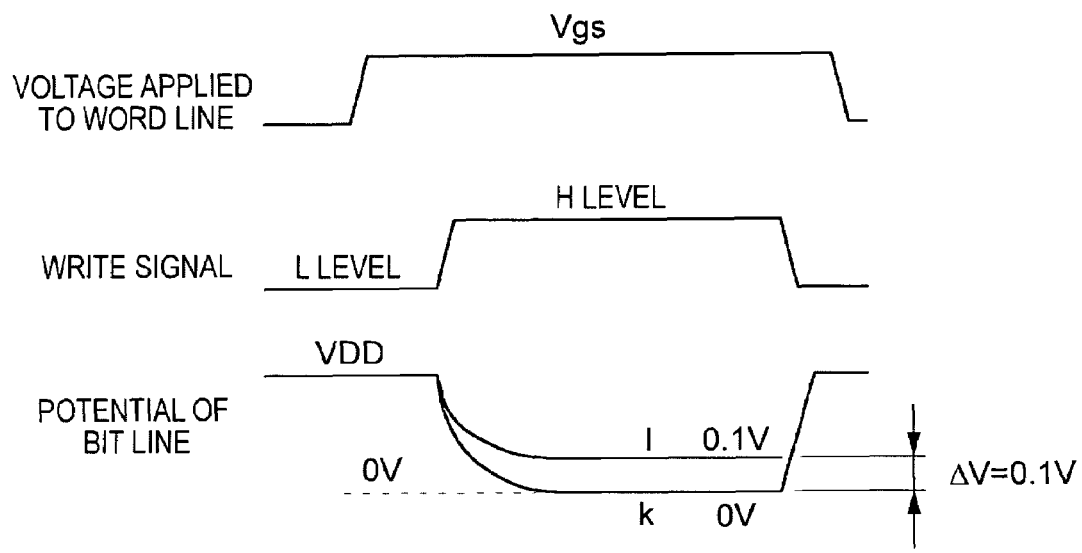
FIGS. 12A and 12B are diagrams explaining an example of the erase operation of a memory cell.

Erase Operation (see FIG. 12A)

[1] To erase information in a memory cell, first, the corresponding row decoder RD applies the gate voltage Vgs to the corresponding word line W to turn on the gate of the MOS transistor T in the memory cell. In addition, the corresponding source decoder SD applies a power supply voltage VDD to the corresponding source line S.

[2] Subsequently, a write signal X to be supplied to the gate terminal of each of the p-type MOS transistor s and the n-type MOS transistor t in the corresponding bit decoder BD is set to the H level to turn on the n-type MOS transistor t, thus applying an erase voltage to the corresponding bit line B. Consequently, a voltage equal to or higher than the erase threshold voltage is applied to the memory cell, thus erasing information in the memory element.

[3] After a lapse of sufficient time, the bit line potential indicates a constant value (i.e., in the steady state). Accordingly, the bit line potential is measured to determine whether the erase operation is performed.

In other words, when the erase operation is performed and the memory element is switched into the insulating state, a current flows very little through the memory cell. Therefore, the bit line potential is approximately 0 V (refer to symbol k in FIG. 12A). On the other hand, if the erase operation is not performed and the memory element is kept in the conducting state, the bit line potential is determined by the ratio of the on-resistance of the p-type MOS transistor s to that of the memory cell. When the on-resistance of the p-type MOS transistor s is 10 times higher than that of the memory cell, the bit line potential is approximately 0.1 V (refer to symbol 1 in FIG. 12A). Therefore, the bit line potential is measured on condition that a reference potential R of the sense amplifier u is set to 0.05 V. When the bit line potential is equal to or higher than 0.05 V, it is determined that the erase operation is performed and the memory element is switched into the insulating state.

[4] After it is confirmed that the memory element is switched into the insulating state and the erase operation is performed, the write signal X is set to the L level and the falling edge of the word line W is caused, thus terminating the erase operation.

Figure 12B:
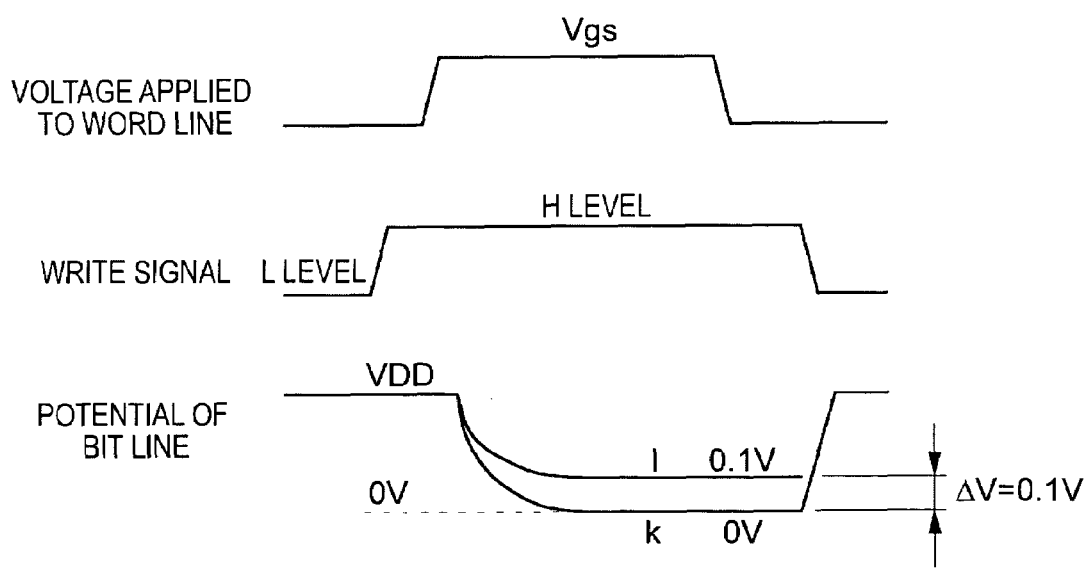

In the above description, after the rising edge of the word line, the write signal is set to the H level. Alternatively, as shown in FIG. 12B, after the write signal is set to the H level, the rising edge of the word line can be caused.

In order not to perform the erase operation in each memory cell in which information has not to be erased, a voltage of 0 V is applied to the word lines W other than the word line W corresponding to the memory cell in which information has to be erased and the potential to be applied to the source lines S other than the source line S corresponding to the memory cell, in which information has to be erased, is the same as that to the bit lines B other than the bit line B corresponding thereto.

In the above description, according to the present embodiment, a voltage drop occurred in the corresponding bit decoder BD is measured to determine whether the erase operation is performed in the memory element. Similar to the above-mentioned write operation, the method for determining whether the erase operation is performed is not limited to the measurement of a voltage drop occurred in a bit decoder.

In the memory according to the present embodiment of the present invention, whether the resistance of the corresponding memory element falls within a desired range is detected during a write sequence. Consequently, a read sequence which has been necessary and follows the write sequence is not needed. Advantageously, time necessary for writing can be reduced.

Similarly, whether the resistance of the corresponding memory element falls within a desired range is determined during an erase sequence, so that a read sequence which has been necessary and follows the erase sequence is not needed. Thus, time necessary for erasing can be reduced.

During a write cycle, the following processes can be executed: (1) when desired data is not written, it is determined that a write error occurs; (2) a voltage is applied until desired data is written; and (3) a write voltage is continuously increased until desired data is written. In addition, in each memory cell, the adequate width of a pulse and a proper write voltage can be set. Thus, overwrite can be prevented and write speed and power consumption can be reduced.

Similarly, during an erase cycle, the following processes can be executed: (1) when desired data is not erased, it is determined that an erase error occurs; (2) a voltage is applied until desired data is erased; and (3) an erase voltage is continuously increased until desired data is erased. In addition, in each memory cell, the adequate width of a pulse and a proper erase voltage can be set. Thus, overerase can be prevented and erase speed and power consumption can be reduced.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
   a plurality of memory cells, each memory cell including a memory element and a transistor connected in series with the memory element, the memory cells arranged in a matrix having rows and columns, each memory cell corresponding to one bit of information and having such characteristics that (a) when an electric signal at a voltage level equal to or higher than that of a first threshold signal is applied to the memory element of the memory cell, the resistance thereof is changed from a high value to a low value, and (b) when an electric signal at a voltage level equal to or higher than that of a second threshold signal is applied thereto, the resistance is changed from the low value to the high value, the polarities of the first and second threshold signals being different from each other;
   electric circuits operative for applying said electric signals to each of the memory cells and configured to perform a write operation; and
   respective detection units associated with each column of said matrix and operative to measure (a) a current flowing through at least one memory element or (b) a voltage applied to at least one memory element from the start of applying electric signals from an electric circuit to the memory element by comparing the current or the voltage, respectively, with a reference signal to detect whether the resistance of the memory element is high or low,
   wherein,
      each of the detection units accepts a write signal of a first level or a second level, applies a signal to a selected memory element, and detects a state of the selected memory element by comparing a voltage or current of a steady state signal returned from the selected memory element with the reference signal during the write operation, the write signal returns to a level preceding the write signal to terminate a write operation in response to a determination the steady state signal corresponds to a bit being written to the selected memory element, and
   one of said electric signals is applied to one of said plurality of memory cells to switch the corresponding transistor from an off-state to an on-state.

2. The memory device according to claim 1, wherein
   each of the electric circuits controls an electric signal by means of the write signal,
   each of the detection units compares a voltage obtained by converting a current flowing through the corresponding memory element or a voltage applied to the memory element with a reference voltage,
   the electric circuits increase the voltage level in response to a detection the state of the selected memory element that does not correspond to the bit being written, and
   a width of a pulse and a write voltage of the write signal are established to prevent overwriting, increase write speed, and reduce power consumption.

3. The memory according to claim 1 or 2, wherein
   each memory element includes first and second electrodes and a memory layer arranged between the first and second electrodes, when the electric signal at the level equal to or higher than that of the first threshold signal is applied between the first and second electrodes, the resistance of the memory element is changed from the high value to the low value, when the electric signal at the level equal to or higher than that of the second threshold signal is applied therebetween, the resistance is changed from the low value to the high value, the reference signal is a potential of a bit line, the corresponding transistor is switched to an on state by applying a gate voltage to a word line of a gate of a MOS transistor of the selected memory element, a source decoder applies a ground potential to a source line in communication with the selected memory element, and the write signal is a low level signal applied to an n-type MOS transistor in a bit decoder to turn on a p-type MOS transistor of the selected memory element to apply a write voltage to the bit line of the selected memory element.

4. A memory device comprising:

a plurality of memory cells, each memory cell including a memory element and a transistor connected in series with the memory element, the memory cells are arranged in a matrix having rows and columns, each memory cell corresponding to one bit of information and having such characteristics that (a) when an electric signal at a voltage level equal to or higher than that of a first threshold signal is applied to the memory element of the memory cell, the resistance thereof is changed from a high value to a low value, and (b) when an electric signal at a voltage level equal to or higher than that of a second threshold signal is applied thereto, the resistance is changed from the low value to the high value, the polarities of the first and second threshold signals being different from each other;

electric circuits operative for applying said electric signals and configured to perform a write operation, each electric circuit including a constant current source for applying a current to a corresponding memory element; and respective detection units associated with each column of said matrix and operative to measure a current flowing through at least one memory element from the start of applying electric signals from the corresponding electric circuit to the at least one memory element by comparing the current or voltage, respectively, with a reference signal to detect whether the resistance of the corresponding memory element is high or low, wherein, each of the detection units accepts a write signal of a first level or a second level, applies the write signal to a selected memory element, and detects a state of the selected memory element by comparing a voltage or current of a steady state signal returned from the selected memory element with the reference signal during the write operation, the write signal returning to a level preceding the write signal to terminate the write operation in response to a determination that the steady state signal corresponds to a bit being written to the selected memory element, and one of said electric signals is applied to one of said plurality of memory cells to switch the corresponding transistor from an off-state to an on-state.

5. The memory device according to claim 4, wherein each of the electric circuits controls an electric signal by means of the write signal, each of the detection units compares a voltage obtained by converting a current flowing through the corresponding memory element with a reference voltage, an additional read operation is not utilized to verify that the bit was stored in the selected memory element during the write operation, the electric circuits increase the voltage level in response to a detection that the state of the selected memory element does not correspond to the bit being written, and a width of a pulse and a write voltage of the write signal are established to prevent overwriting, increase write speed, and reduce power consumption.

6. The memory device according to claim 4 or 5, wherein each memory element includes first and second electrodes and a memory layer arranged between the first and second electrodes, when the electric signal at the level equal to or higher than that of the first threshold signal is applied between the first and second electrodes, the resistance of the memory element is changed from the high value to the low value, and when the electric signal at the level equal to or higher than that of the second threshold signal is applied therebetween, the resistance is changed from the low value to the high value, the reference signal is a potential of a bit line, the corresponding transistor is switched to an on state by applying a gate voltage to a word line of a gate of a MOS transistor of the selected memory element, a source decoder applies a ground potential to a source line in communication with the selected memory element, the write signal is a low level signal applied to an n-type MOS transistor in a bit decoder to turn on a p-type MOS transistor of the selected memory element to apply a write voltage to the bit line of the selected memory element.

* * * * *